(12) United States Patent
Chung et al.

(10) Patent No.: US 12,745,349 B2
(45) Date of Patent: Sep. 22, 2026

(54) ELECTRONIC DEVICE COMPRISING INTERPOSER PRINTED CIRCUIT BOARD

(71) Applicant: Samsung Electronics Co., Ltd., Suwon-si (KR)

(72) Inventors: Myungkyoon Chung, Suwon-si (KR); Sunyoung Im, Suwon-si (KR); Dohyeong Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 146 days.

(21) Appl. No.: 18/792,851

(22) Filed: Aug. 2, 2024

(65) Prior Publication Data

US 2024/0397625 A1 Nov. 28, 2024

Related U.S. Application Data

(63) Continuation of application No. PCT/KR2023/001560, filed on Feb. 3, 2023.

(30) Foreign Application Priority Data

Feb. 4, 2022 (KR) ........................ 10-2022-0014973

(51) Int. Cl.
*H05K 1/14* (2006.01)

(52) U.S. Cl.
CPC ............. *H05K 1/144* (2013.01); *H05K 1/145* (2013.01); *H05K 2201/096* (2013.01); *H05K 2201/10378* (2013.01)

(58) Field of Classification Search
CPC .. H05K 1/144; H05K 1/145; H05K 2201/096; H05K 2201/10378
See application file for complete search history.

(56) References Cited

U.S. PATENT DOCUMENTS

| | | | | |
|---|---|---|---|---|
| 11,006,524 B2 * | 5/2021 | Myers | .................... | H05K 1/028 |
| 11,121,067 B2 | 9/2021 | Hong | | |

(Continued)

FOREIGN PATENT DOCUMENTS

| | | |
|---|---|---|
| EP | 0828341 A2 | 3/1998 |
| JP | 3521651 B2 | 4/2004 |

(Continued)

OTHER PUBLICATIONS

International Search Report for PCT/KR2023/001560 mailed May 10, 2023, 3 pages.

(Continued)

*Primary Examiner* — Paresh Paghadal
(74) *Attorney, Agent, or Firm* — Nixon & Vanderhye, P.C.

(57) ABSTRACT

An electronic device including an interposer printed circuit board (PCB) may comprise: an interposer PCB including at least two vias; a first PCB including a first direct connection unit including a power supply circuit and configured to directly connect the power supply circuit to a first via, and a first extension connection unit comprising a conductive material configured to connect a second via through a wire extending from the first direct connection unit; and a second PCB including a second direct connection unit including a load circuit and configured to directly connect the load circuit to the second via, and a second extension connection unit comprising a conductive material configured to connect the first via through a wire extending from the second direct connection unit.

15 Claims, 19 Drawing Sheets

(56) References Cited

U.S. PATENT DOCUMENTS

| | | | |
|---|---|---|---|
| 11,217,564 | B2 | 1/2022 | Choi |
| 11,251,156 | B2 | 2/2022 | Mueller et al. |
| 2008/0290511 | A1 | 11/2008 | Van Veen et al. |
| 2009/0180257 | A1 | 7/2009 | Lee et al. |
| 2009/0273073 | A1 | 11/2009 | Tachibana et al. |
| 2009/0321904 | A1 | 12/2009 | Tanaka |
| 2011/0317387 | A1 | 12/2011 | Pan et al. |
| 2013/0200511 | A1 | 8/2013 | Banijamali |
| 2013/0319737 | A1 | 12/2013 | Hurwitz |
| 2014/0077391 | A1 | 3/2014 | Kikuchi et al. |
| 2014/0167292 | A1 | 6/2014 | Masumura et al. |
| 2017/0330873 | A1 | 11/2017 | Tamura et al. |
| 2018/0098420 | A1 | 4/2018 | Kariyazaki et al. |
| 2019/0244888 | A1 | 8/2019 | Kawashima |
| 2019/0378918 | A1 | 12/2019 | Okamoto et al. |
| 2020/0093040 | A1 | 3/2020 | Yun et al. |
| 2020/0128669 | A1* | 4/2020 | Schober ................. H05K 1/144 |
| 2020/0136243 | A1 | 4/2020 | Shin et al. |
| 2021/0045244 | A1 | 2/2021 | Mcmorrow et al. |
| 2022/0005757 | A1* | 1/2022 | Oh ...................... H10W 70/635 |

FOREIGN PATENT DOCUMENTS

| | | | |
|---|---|---|---|
| JP | 2009516369 | A | 4/2009 |
| JP | 2010212296 | A | 9/2010 |
| JP | 2011061132 | A | 3/2011 |
| JP | 5916898 | B2 | 4/2016 |
| JP | 6076068 | B2 | 1/2017 |
| JP | 2017092268 | A | 5/2017 |
| JP | 6322345 | B2 | 4/2018 |
| JP | 2019140364 | A | 8/2019 |
| JP | 2020107908 | A | 7/2020 |
| KR | 20090078492 | A | 7/2009 |
| KR | 20140035857 | A | 3/2014 |
| KR | 101439565 | B1 | 9/2014 |
| KR | 20140135928 | A | 11/2014 |
| KR | 101654216 | B1 | 9/2016 |
| KR | 10-2020-0032911 | | 3/2020 |
| KR | 20200046246 | A | 5/2020 |
| KR | 20200099261 | A | 8/2020 |
| KR | 20210056853 | A | 5/2021 |
| WO | 2017111792 | A1 | 6/2017 |

OTHER PUBLICATIONS

Written Opinion of the ISA for PCT/KR2023/001560 mailed May 10, 2023, 3 pages.

Korean Notice of Allowance issued Jun. 22, 2026 in corresponding Korean Patent Application No. 10-2022-0014973.

* cited by examiner

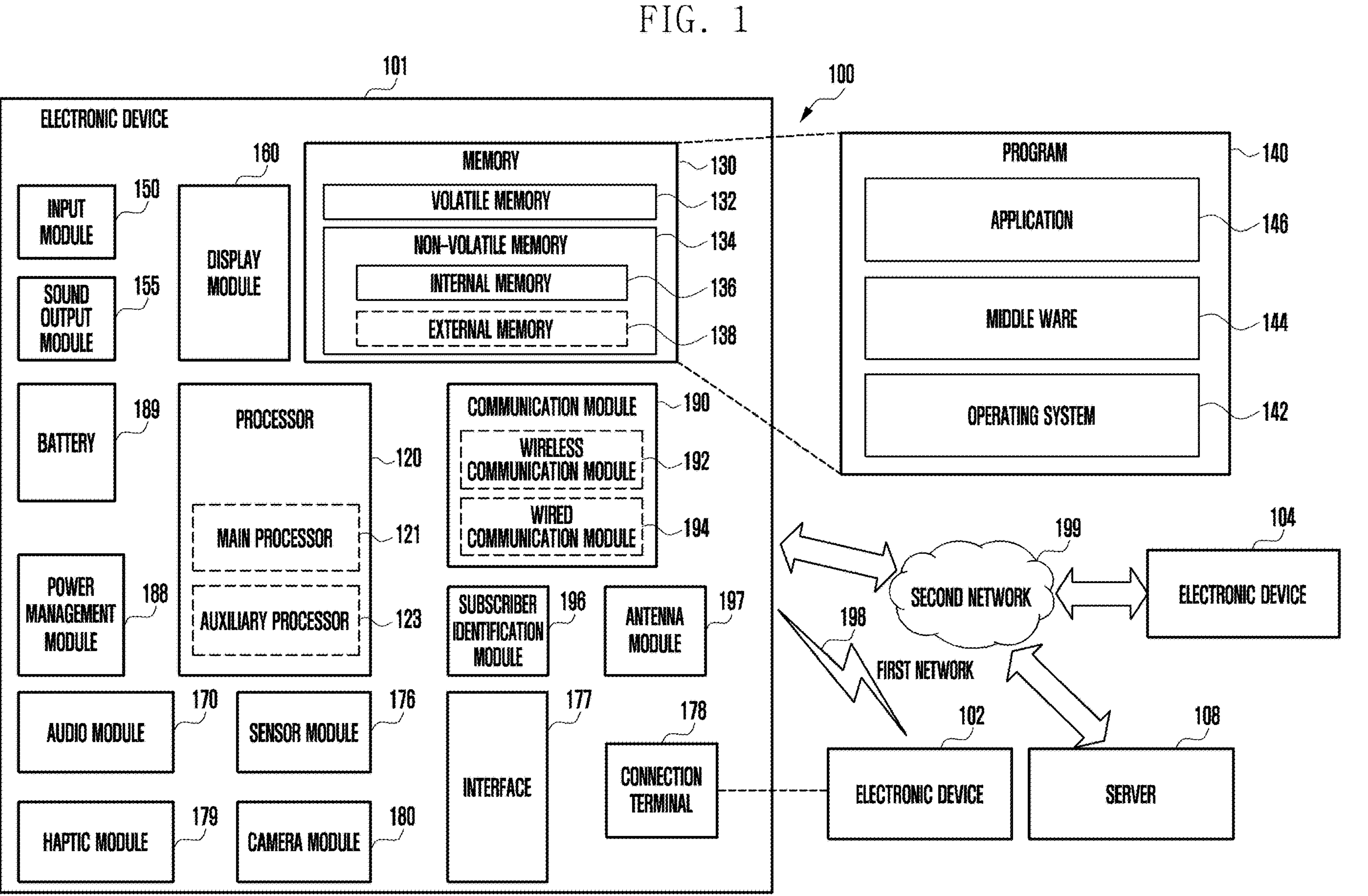
FIG. 1
101
100
ELECTRONIC DEVICE
INPUT MODULE
150
DISPLAY MODULE
160
SOUND OUTPUT MODULE
155
MEMORY
130
VOLATILE MEMORY
132
NON-VOLATILE MEMORY
134
INTERNAL MEMORY
136
EXTERNAL MEMORY
138
PROGRAM
140
APPLICATION
146
MIDDLE WARE
144
OPERATING SYSTEM
142
BATTERY
189
PROCESSOR
120
MAIN PROCESSOR
121
AUXILIARY PROCESSOR
123
COMMUNICATION MODULE
190
WIRELESS COMMUNICATION MODULE
192
WIRED COMMUNICATION MODULE
194
POWER MANAGEMENT MODULE
188
SUBSCRIBER IDENTIFICATION MODULE
196
ANTENNA MODULE
197
SECOND NETWORK
199
ELECTRONIC DEVICE
104
198
FIRST NETWORK
AUDIO MODULE
170
SENSOR MODULE
176
INTERFACE
177
CONNECTION TERMINAL
178
ELECTRONIC DEVICE
102
SERVER
108
HAPTIC MODULE
179
CAMERA MODULE
180

210
713
714
233
224
702
701
234
223
711
712
230
220
222
221
231
232
101

101
1010
1011
1012
1013
N1
N3
1030
1031
1032
1020
1021
1022
1023
N2
N4
G

ELECTRONIC DEVICE COMPRISING INTERPOSER PRINTED CIRCUIT BOARD

CROSS-REFERENCE TO RELATED APPLICATIONS

This application is a continuation of International Application No. PCT/KR2023/001560 designating the United States, filed on Feb. 3, 2023, in the Korean Intellectual Property Receiving Office and claiming priority to Korean Patent Application No. 10-2022-0014973, filed on Feb. 4, 2022, in the Korean Intellectual Property Office, the disclosures of each of which are incorporated by reference herein in their entireties.

BACKGROUND

Field

The disclosure relates to an electronic device including an interposer printed circuit board.

Description of Related Art

Recently, electronic devices such as smartphones, tablet personal computers, or laptop personal computers have been equipped with a plurality of printed circuit boards that perform various functions such as cameras, audio devices, and displays.

As electronic devices become slimmer, a plurality of printed circuit boards may be stacked to secure mounting space for printed circuit boards.

When stacking a plurality of printed circuit boards using an interposer printed circuit board (PCB), interposer vias may be allocated in consideration of the maximum current for each power wire.

Since many wires pass through the interposer PCB, if two or more interposer vias are allocated, a difference in direct current resistance (DCR) may occur depending on the length of the wire. If there is a difference in direct current resistance depending on the length of the wire, current distribution may become imbalanced, resulting in power loss in the wire. In addition, heat may be generated due to loss of power.

SUMMARY

Embodiments of the disclosure provide an electronic device that balances the current flowing through the interposer via when power wires are connected.

According to an example embodiment, an electronic device of the disclosure including an interposer printed circuit board (PCB) may include: an interposer PCB including at least two vias; a first PCB including a first direct connection unit including a power supply circuit and is configured to directly connect the power supply circuit to a first via, and a first extension connection unit comprising a conductive material configured to connect a second via through a wire extending from the first direct connection unit; and a second PCB including a second direct connection unit including a load circuit and configured to directly connect the load circuit to the second via, and a second extension connection unit comprising a conductive material configured to connect the first via through a wire extending from the second direct connection unit.

According to an example embodiment, an electronic device of the disclosure including an interposer PCB may include an interposer PCB including: at least two vias; a first PCB including a power supply circuit and a first contact portion electrically connected to the power supply circuit and configured to connect to the at least two vias through a bridge structure; and a second PCB including a load circuit and a second contact portion electrically connected to the power supply circuit and configured to connect to the at least two vias through a bridge structure.

The electronic device according to various example embodiments of the disclosure may suppress heat generation by balancing the current flowing through the vias of the interposer in wiring of power.

The electronic device according to various example embodiments of the disclosure may improve the stability of the power line by balancing the current flowing through the vias of the interposer in wiring of power.

BRIEF DESCRIPTION OF THE DRAWINGS

In connection to the description of the drawings, identical or similar reference numerals may be used for identical or similar elements. Further, the above and other aspects, features and advantages of certain embodiments of the present disclosure will be more apparent from the following detailed description, taken in conjunction with the accompanying drawings, in which:

FIG. 1 is a block diagram illustrating an example electronic device in a network environment according to various embodiments;

DETAILED DESCRIPTION

Figure 2:
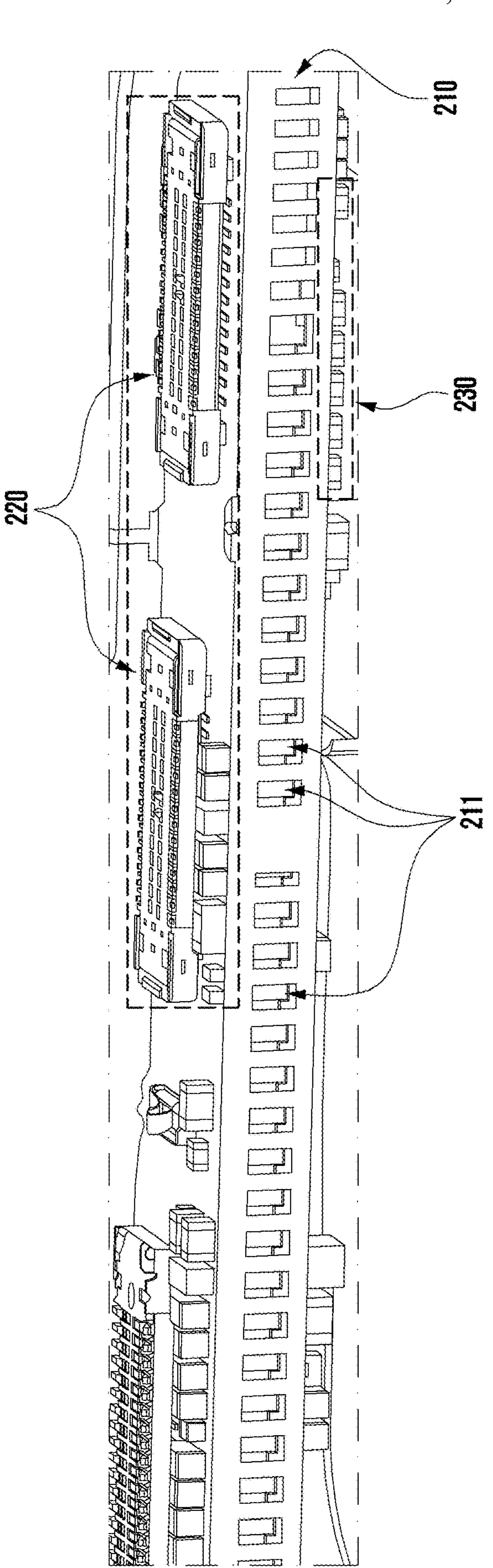
FIG. 2 is a diagram illustrating an electronic device including an interposer printed circuit board according to various embodiments.

FIG. 1 is a block diagram illustrating an example electronic device 101 in a network environment 100 according to various embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may include various processing circuitry and/or multiple processors. For example, as used herein, including the claims, the term "processor" may include various processing circuitry, including at least one processor, wherein one or more of at least one processor, individually and/or collectively in a distributed manner, may be configured to perform various functions described herein. As used herein, when "a processor", "at least one processor", and "one or more processors" are described as being configured to perform numerous functions, these terms cover situations, for example and without limitation, in which one processor performs some of recited functions and another processor(s) performs other of recited functions, and also situations in which a single processor may perform all recited functions. Additionally, the at least one processor may include a combination of processors performing various of the recited/disclosed functions, e.g., in a distributed manner. At least one processor may execute program instructions to achieve or perform various functions. The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (cMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

FIG. 2 is a diagram illustrating an example electronic device 101 including an interposer printed circuit board 210 according to various embodiments.

Figure 3:
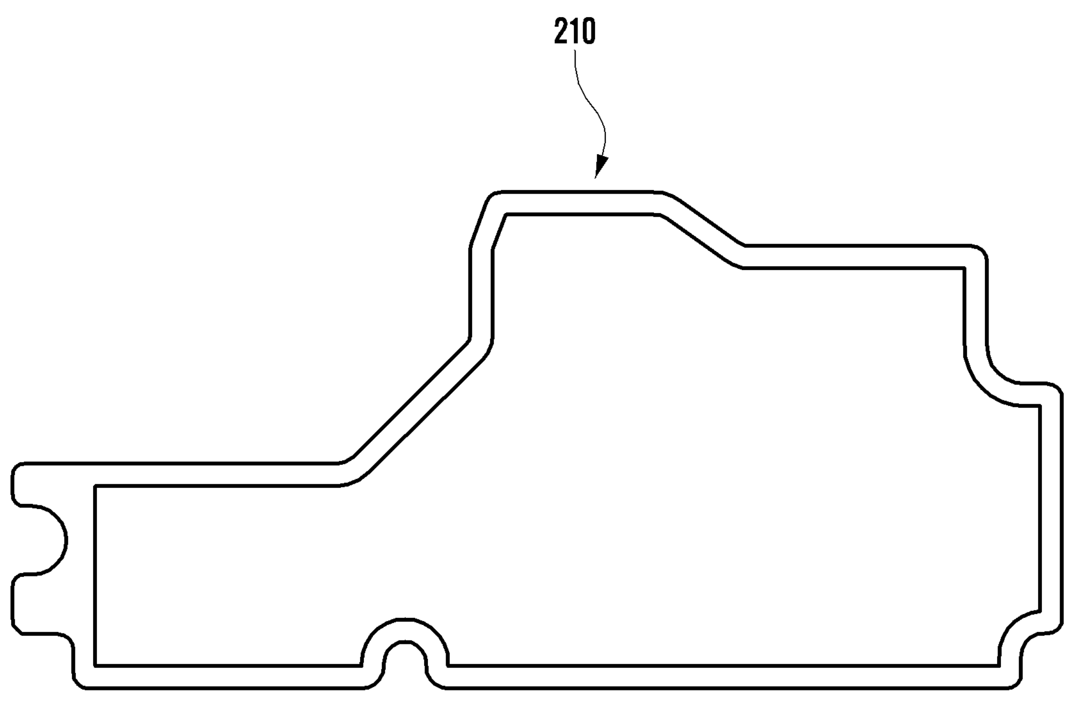
FIG. 3 is a diagram illustrating a front view of an interposer printed circuit board according to various embodiments.

FIG. 3 is a diagram illustrating a front view of an interposer printed circuit board 210 according to various embodiments.

Figure 4:
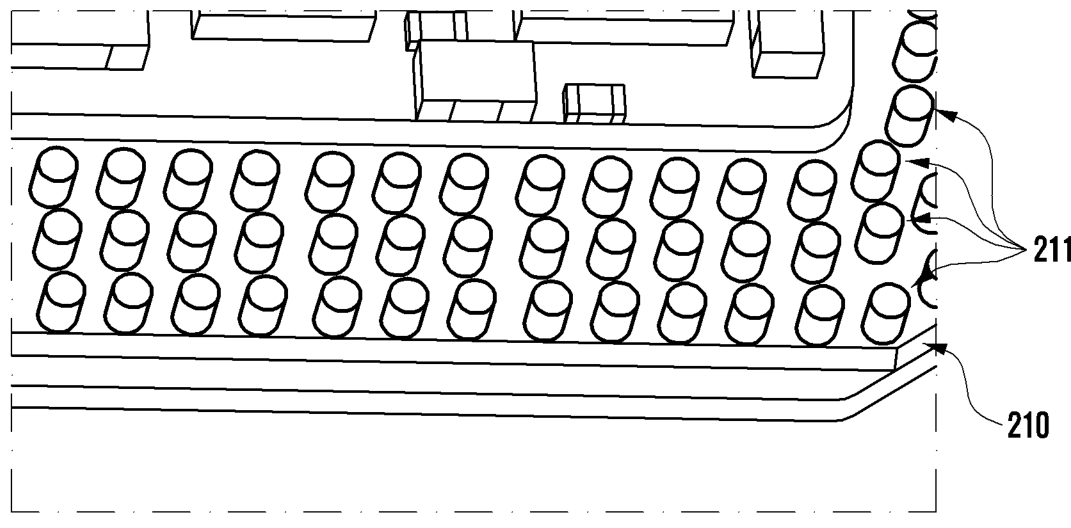
FIG. 4 is a perspective view illustrating an example configuration of an interposer printed circuit board according to various embodiments.

FIG. 4 is a diagram illustrating an example configuration of an interposer printed circuit board 210 according to various embodiments.

Referring to FIGS. 2, 3 and 4 (which may be referred to as FIGS. 2 to 4), the electronic device 101 may include an interposer PCB 210, a first printed circuit board (PCB) 220, and a second PCB 230.

In an embodiment, the electronic device 101 may stack the first PCB 220 and the second PCB 230 using the interposer PCB 210.

In an embodiment, the interposer PCB 210, the first PCB 220, and the second PCB 230 may be stacked. The interposer PCB 210, the first PCB 220, and the second PCB 230 may be vertically stacked.

In an embodiment, the interposer PCB 210 may electrically connect PCBs to each other.

In various embodiments, the interposer PCB 210 may electrically connect the PCB and an integrated circuit (IC).

In an embodiment, based on the interposer PCB 210, the interposer PCB 210 may be electrically connected to the first PCB 220 on the first side of the interposer PCB 210 and electrically connected to the second PCB 230 on the second side thereof.

In an embodiment, the first PCB 220 and the second PCB 230 may be electrically connected through the interposer PCB 230. The first PCB 220 and the second PCB 230 may be electrically connected with the interposer PCB 230 interposed therebetween.

In an embodiment, the interposer PCB 230 may include one or more vias. The interposer PCB 230 may include one or more through-type vias. The interposer PCB 230 may include one or more vias 211 to electrically connect the first PCB 220 and the second PCB 230.

In various embodiments, the first PCB 220 and the second PCB 230 may include one or more vias to be electrically connected to the interposer PCB 230.

In an embodiment, the interposer PCB 230 may have the same thermal expansion coefficient as the first PCB 220 and/or the second PCB 230.

In an embodiment, the interposer PCB 230 may be shaped to resemble the outer shape of the first PCB 220 and/or the second PCB 230.

Figure 5:
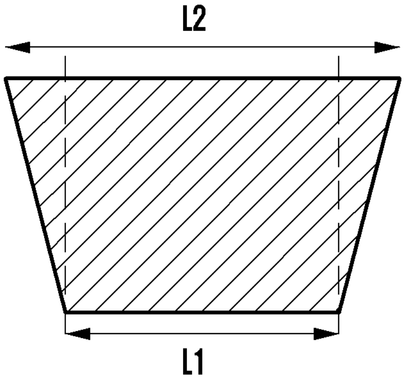
FIG. 5 is a diagram illustrating example structures of vias included in an interposer PCB, a first PCB, and/or a second PCB according to various embodiments.

FIG. 5 is a diagram illustrating example structures of vias included in the interposer PCB 210, the first PCB 220, and/or the second PCB 230 according to various embodiments.

Figure 6:
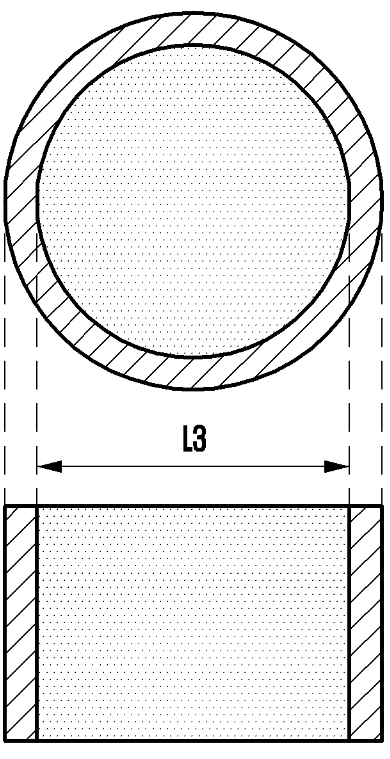
FIG. 6 is a diagram illustrating example structures of vias included in an interposer PCB, a first PCB, and/or a second PCB according to various embodiments.

FIG. 6 is a diagram illustrating example structures of vias included in the interposer PCB 210, the first PCB 220, and/or the second PCB 230 according to various embodiments.

Referring to FIGS. 5 and 6, at least a portion of the via (e.g., the via 211 in FIG. 4) may be a material with electrically conductive properties. The via (e.g., the via 211 in FIG. 4) may include glass, silicon, organic materials, and/or metal, or a combination thereof.

In an embodiment, the via (e.g., the via 211 in FIG. 4) may be formed through a process of machining the interposer PCB 210. For example, the vias may be formed by performing drilling, laser processing, etching, and/or power blast processing on the interposer PCB 210.

In an embodiment, the via (e.g., the via 211 in FIG. 4) may be formed by forming a through-hole through a processing process and depositing and/or plating a metal (e.g., copper (Cu)).

In an embodiment, the resistance of the via (e.g., the via 211 in FIG. 4) may be determined by the inner diameter of the via and/or the thickness of metal plated thereon.

Referring to FIG. 5, the via (e.g., the via 211 in FIG. 4) may be formed through laser processing.

The via formed through laser processing (e.g., the via 211 in FIG. 4) may have the shape of a truncated cone and may be trapezoidal when viewed from the front. Among the two inner diameters, the shorter inner diameters (L1) may be 70 to 80% of the longer inner diameter (L2). If the inner diameter of a via (e.g., the via 211 in FIG. 4) formed through laser processing is about 0.1 mm, the allowable current for the via may be 460 mA.

Referring to FIG. 6, the via (e.g., the via 211 in FIG. 4) may be formed through drilling. The via formed through drilling (e.g., the via 211 in FIG. 4) may be cylindrical. If the inner diameter (L3) of the via (e.g., the via 211 in FIG. 4) formed through drilling is about 0.2 mm, the current for the via may be 500 mA.

Figure 7:
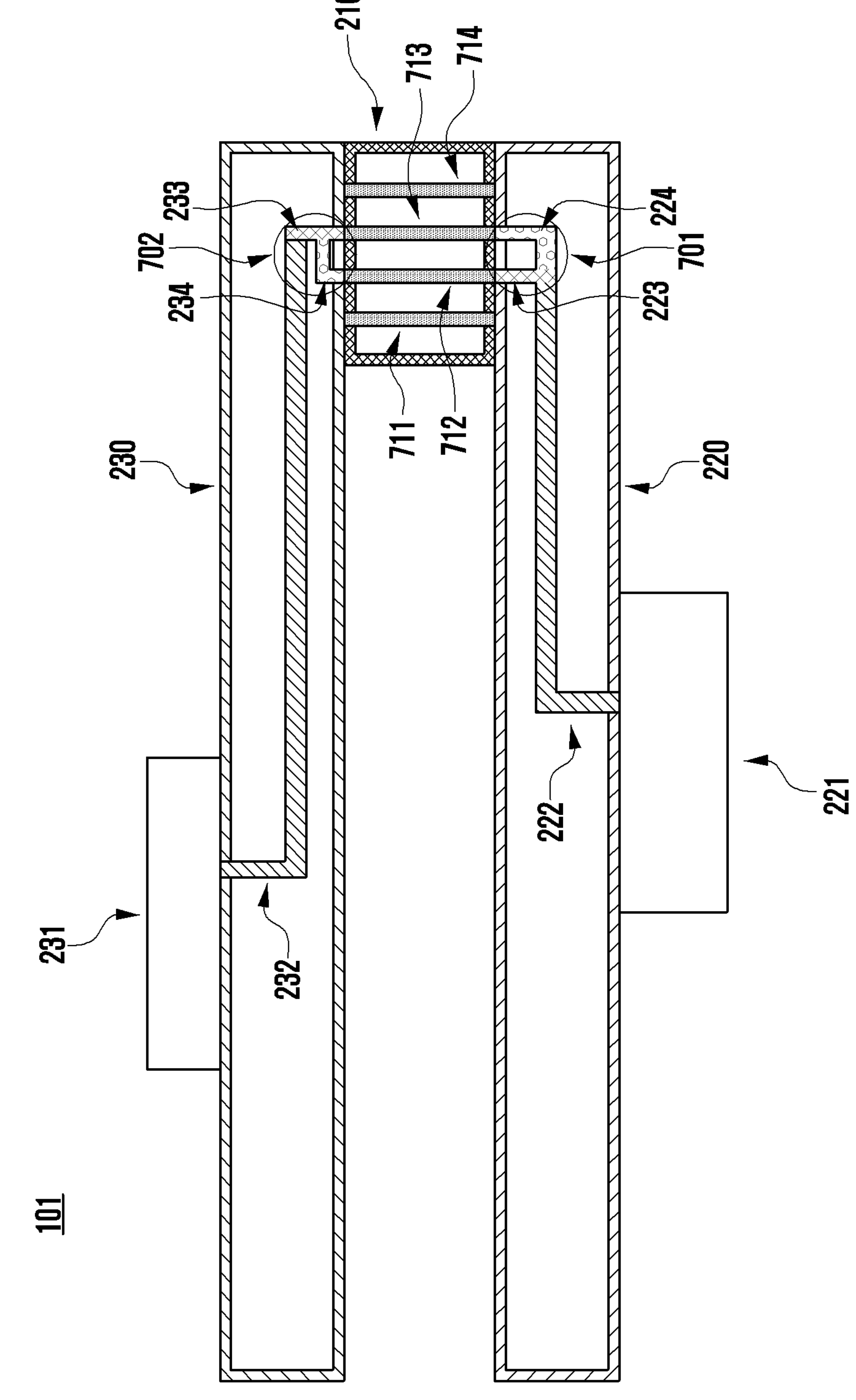
FIG. 7 is a cross-sectional view illustrating a structure of an electronic device including an interposer PCB according to various embodiments.

FIG. 7 is a cross-sectional vie illustrating an example structure of an electronic device 101 including an interposer PCB 210 according to various embodiments.

Figure 8:
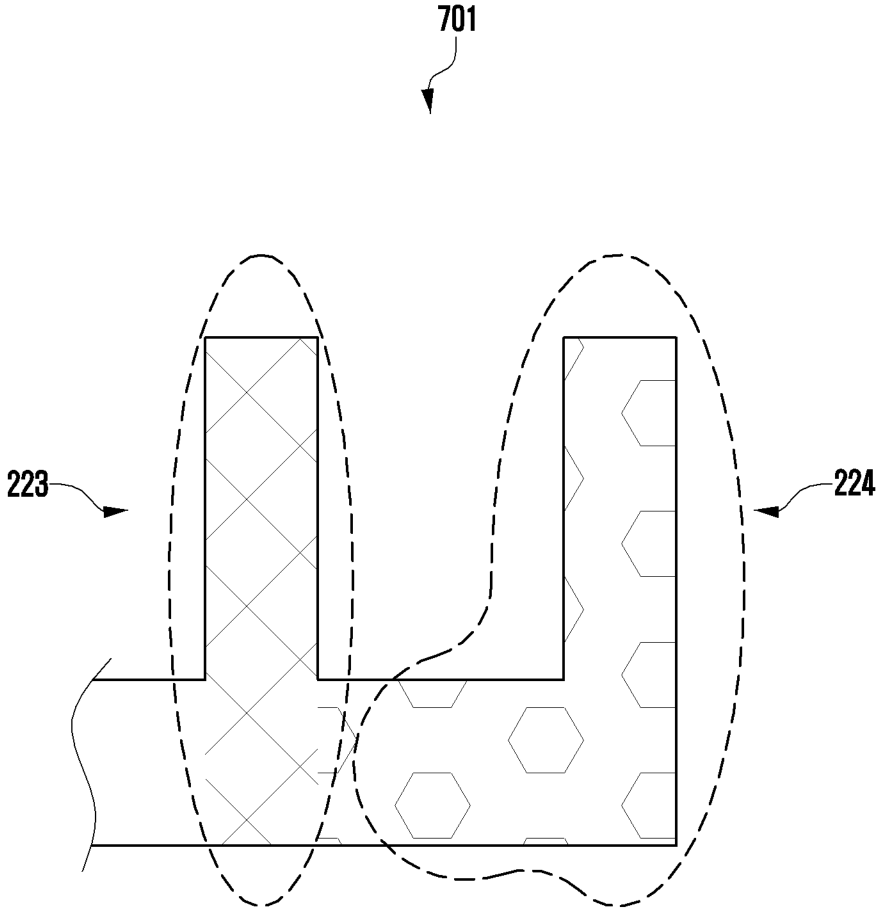
FIG. 8 is a diagram illustrating an example first contact portion according to various embodiments.

FIG. 8 is a diagram illustrating a first contact portion 701 according to various embodiments.

Figure 9:
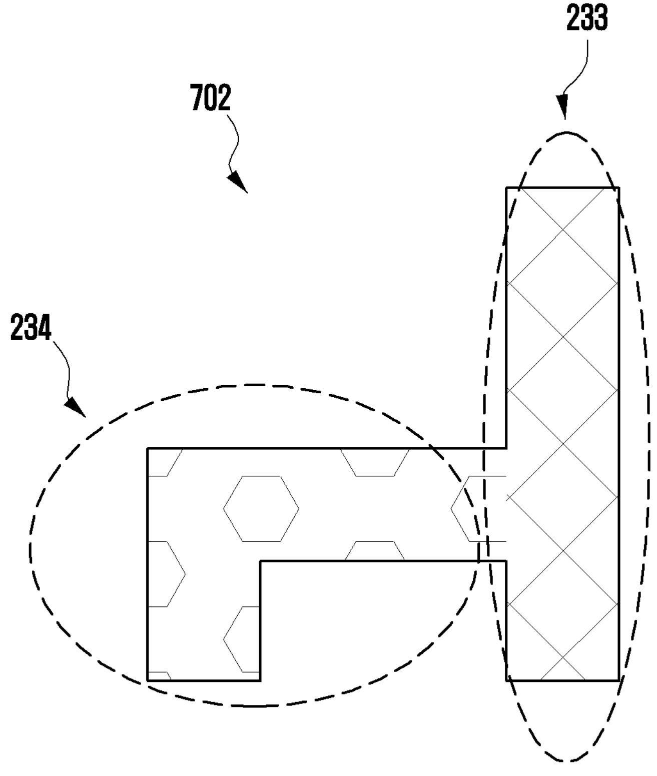
FIG. 9 is a diagram illustrating an example second contact portion according to various embodiments.

FIG. 9 is a diagram illustrating a second contact portion 702 according to various embodiments.

Referring to FIGS. 7, 8 and 9 (which may be referred to as FIGS. 7 to 9), the electronic device 101 may include an interposer PCB 210, a first PCB 220, and a second PCB 230.

In an embodiment, the interposer PCB 210 may include one or more vias 711, 712, 713, and 714.

One or more vias 711, 712, 713, and 714 in FIG. 7 may have the same or similar shape as the via in FIG. 6.

In an embodiment, the interposer PCB 210 may include a first via 711, a second via 712, a third via 713, and a fourth via 714. In various embodiments, the interposer PCB 210 may include more than four vias 711, 712, 713, and 714. The interposer PCB 210 may include at least two vias.

In an embodiment, the interposer PCB 210 may electrically connect the first PCB 220 and the second PCB 230 through the second via 712 and the third via 713. The interposer PCB 210 may be electrically connected to the first PCB 220 through the first contact portion 701 of the first PCB 220. The interposer PCB 210 may be electrically connected to the second PCB 230 through the second contact portion 702 of the second PCB 220.

In an embodiment, the first PCB 220 and the second PCB 230 may have a stacked structure including a plurality of PCB layers.

In various embodiments, the first PCB 220 and the second PCB 230 may be electrically connected through a power rail that allocates at least two vias of the interposer 210.

In an embodiment, the first PCB 220 may include a first conductive path 222. The first conductive path 222 may include a penetrating electrode for electrically connecting a plurality of PCB layers. The first conductive path 222 may include a plurality of wires included in the first PCB 220 as a conductive path.

In an embodiment, the second PCB 230 may include a second conductive path 232. The second conductive path 232 may include a penetrating electrode for electrically connecting a plurality of PCB layers. The second conductive path 232 may include a plurality of wires included in the second PCB 230 as a conductive path. The through electrode may be identical or similar to the via structure included in FIGS. 5 and/or 6.

In an embodiment, the first PCB 220 may have one side electrically connected to the interposer PCB 210, and the side, which is not connected to the interposer PCB 210, having electronic components disposed thereon. The first PCB 220 may include a power supply circuit (power supply IC) 221. The first PCB 220 may supply power output through the power supply circuit 221 to the second PCB 230.

In an embodiment, the first PCB 220 may include a first conductive path 222 and a first contact portion 701. The first conductive path 222 may be connected to the first contact portion 701.

Referring to FIG. 8, the first contact portion 701 may include a bridge structure. The first contact portion 701 may include a first direct connection unit (e.g., including a conductive material) 223 and a first extension connection unit (e.g., including a conductive material) 224.

In an embodiment, the first contact portion 701 may include a first direct connection unit 223 that directly connects the first conductive path 222 and the vias included in the interposer PCB 210. The first contact portion 701 may include a first extension connection unit 224 that extends from the first conductive path 222 and/or the first direct connection unit 223 and electrically connects the vias included in the interposer PCB 210.

In an embodiment, the first direct connection unit 223 may be connected to the second via 712, and the first extension connection unit 224 may be connected to the third via 713. The first PCB 220 may electrically connect the first conductive path 222 and the second via 712 through the first direct connection unit 223. The first PCB 220 may electrically connect the first conductive path 223 and the third via 713 through the first extension connection unit 224. The first conductive path 222 may be connected to the third via 713 through the first extension connection unit 224, thereby increasing the length of the wire, compared to the case where the first direct connection unit 223 and the second via 712 are connected.

In an embodiment, the second PCB 230 may have one side electrically connected to the interposer PCB 210, and the side, which is not connected to the interposer PCB 210, having electronic components disposed thereon. The second PCB 230 may include a load circuit (load IC) 231. The second PCB 230 may supply power output from the power supply circuit 221 of the first PCB 220 to the load circuit 231.

In an embodiment, the second PCB 230 may include a second conductive path 232 and a second contact portion 702. The second conductive path 232 may be connected to the second contact portion 702.

Referring to FIG. 9, the second contact portion 702 may include a bridge structure. The second contact portion 702 may include a second direct connection unit (e.g., including a conductive material) 233 and a second extension connection unit (e.g., including a conductive material) 234.

In an embodiment, the second contact portion 702 may include a second direct connection unit 233 that directly connects the second conductive path 232 and the vias included in the interposer PCB 210. The second contact portion 702 may include a second extension connection unit 234 that extends from the second conductive path 232 and/or the second direct connection unit 233 and electrically connects the vias included in the interposer PCB 210.

In an embodiment, the second direct connection unit 233 may be connected to the third via 713, and the second extension connection unit 224 may be connected to the second via 712. The second PCB 230 may electrically connect the second conductive path 222 and the third via 713 through the second direct connection unit 233. The second PCB 230 may electrically connect the second conductive path 233 and the second via 712 through the second extension connection unit 234. The second conductive path 232 may be connected to the second via 712 through the second extension connection unit 234, thereby increasing the length of the wire, compared to the case where the second direct connection unit 233 and the third via 713 are connected.

In an embodiment, based on the first direct connection unit 223, the first conductive path 222 may be disposed in the −x-axis direction, and the first extension connection unit 224 may be disposed in the +x-axis direction. Based on the first direct connection unit 223, the first extension connection unit 224 in the +x-axis direction and the third via 713 may be connected. The first direct connection unit 223 may be disposed in a direction close to the first conductive path 222, and the first extension connection unit 224 may be disposed in a direction far from the first conductive path 222.

In an embodiment, the second direct connection unit 233 may be connected to the third via 713 that is not connected to the first direct connection unit 223, and the second extension connection unit 234 may be connected to the second via 712 that is not connected to the first extension connection unit 224.

In various embodiments, if the first contact portion 701 is connected to the third via 713 and the first direct connection unit 223, the second contact portion 702 may be connected to the second via 712 and the second direct connection unit 233. At this time, the first extension connection unit 224 may be connected to the second via 712, and the second extension connection unit 234 may be connected to the third via 713.

In various embodiments, if the first direct connection unit 223 is connected to the first via 711, the second direct connection unit 233 may be connected to at least one of the second via 712, the third via 713, or the fourth via 714. At this time, the second extension connection unit 234 may be connected to the first via 711, and the first extension connection unit 224 may be connected to the via that is connected to the second direct connection unit 233.

In various embodiments, if the first direct connection unit 223 is connected to the second via 712, the second direct connection unit 233 may be connected to at least one of the first via 711, the third via 713, or the fourth via 714. At this time, the second extension connection unit 234 may be connected to the second via 712, and the first extension connection unit 224 may be connected to the via that is connected to the second direct connection unit 233.

In various embodiments, if the first direct connection unit 223 is connected to the third via 713, the second direct connection unit 233 may be connected to at least one of the first via 711, the second via 712, or the fourth via 714. At this time, the second extension connection unit 234 may be connected to the third via 713, and the first extension connection unit 224 may be connected to the via that is connected to the second direct connection unit 233.

In various embodiments, if the first direct connection unit 223 is connected to the fourth via 714, the second direct connection unit 233 may be connected to the first via 711, the second via 712, or the third via 713. At this time, the second extension connection unit 234 may be connected to the fourth via 714, and the first extension connection unit 224 may be connected to the via that is connected to the second direct connection unit 233.

In an embodiment, referring to FIG. 7, in the first PCB 220 and the second PCB 230, the direct connection units (e.g., the first direct connection unit 223 and the second direct connection unit 233), which directly connect the first conductive path 222 and the second conductive path 232, may be connected through different vias, instead of the same via. The first PCB 220 and the second PCB 230 may adjust direct current resistance (DCR) through the extension connection units (e.g., the first extension connection unit 224 and the second extension connection unit 234) having extended wires, thereby improving current balance.

Figure 10:
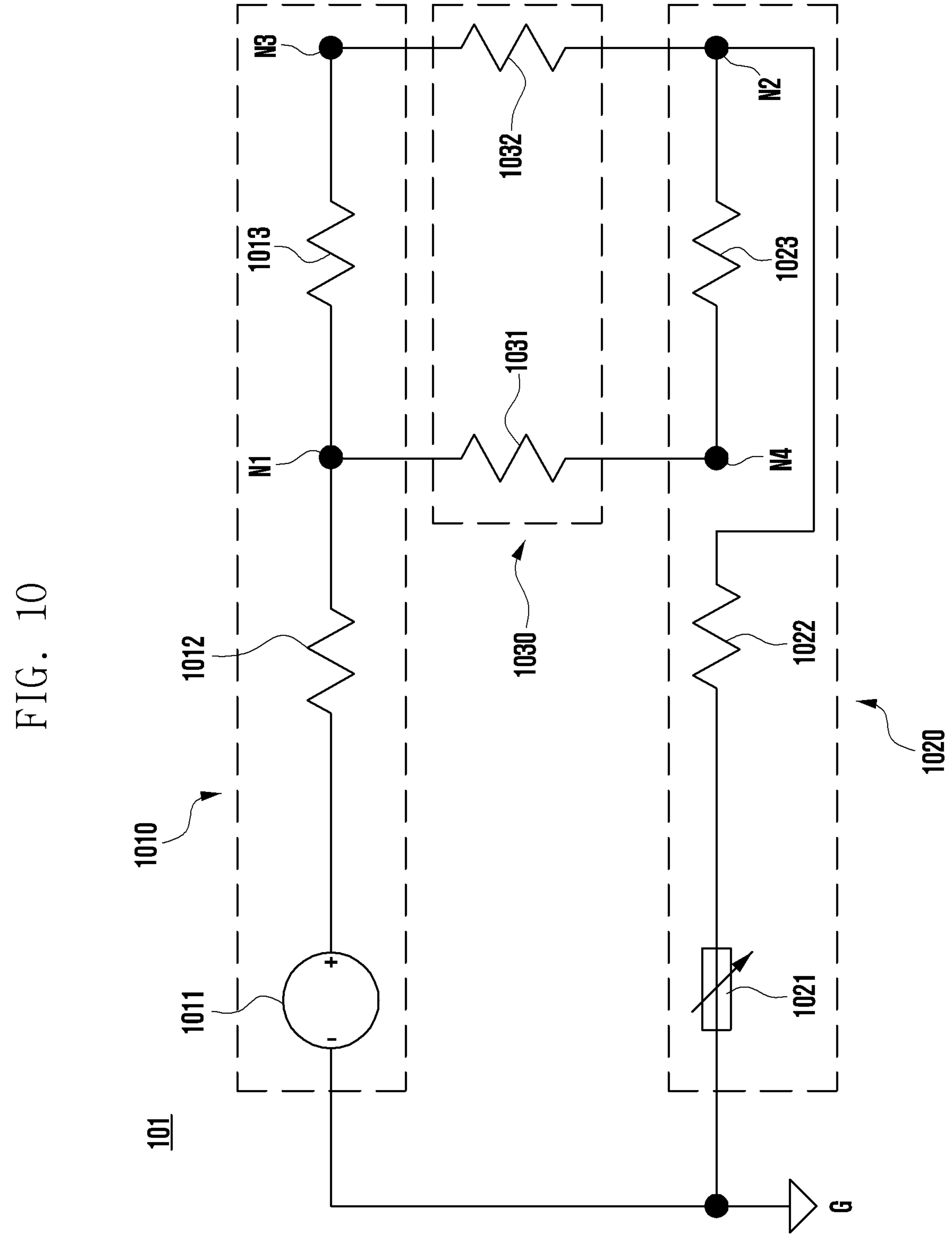
FIG. 10 is a diagram illustrating an equivalent circuit of an electronic device including the interposer PCB in FIG. 7 according to various embodiments.

FIG. 10 is a diagram illustrating an equivalent circuit of an electronic device 101 including the interposer PCB 210 in FIG. 7 according to various embodiments.

Referring to FIGS. 7 and 10, the electronic device 101 including the interposer PCB 210 may include a first equivalent circuit 1010, a second equivalent circuit 1020, and a third equivalent circuit 1030. The first equivalent circuit 1010, the second equivalent circuit 1020, and the third equivalent circuit 1030 may be electrically connected.

In an embodiment, the first equivalent circuit 1010 represents the equivalent circuit of the first PCB 220. The second equivalent circuit 1020 represents the equivalent circuit of the second PCB 230. The third equivalent circuit 1030 represents the equivalent circuit of the interposer PCB 210.

In an embodiment, the first equivalent circuit 1010 may include a power source 1011, a first internal resistance 1012, and a first wire resistance 1013. The power source 1011 is an equivalent circuit representing the power output from the power supply circuit 221. The first internal resistance 1012 is an equivalent circuit representing the resistance values of the first conductive path 222 and the first direct connection unit 223. The first internal resistance 1012 may be connected to the first wire resistance 1013 and the first via resistance 1031 through a first node N1. The first wire resistance 1013 is an equivalent circuit representing the resistance value of the first extension connection unit 224. The first wire resistance 1013 may be connected to the second via resistance 1032 through a third node N3.

In an embodiment, the second equivalent circuit 1201 may include a load resistance 1021, a second internal resistance 1022, and a second wire resistance 1023. The load resistance 1021 is an equivalent circuit representing the resistance of the load circuit 231. The second internal resistance 1022 is an equivalent circuit representing the resistance values of the second conductive path 232 and the second direct connection unit 233. The second internal resistance 1022 may be connected to the second wire resistance 1023 and the second via resistance 1032 through a second node N2. The second wire resistance 1023 is an equivalent circuit representing the resistance value of the second extension connection unit 234. The second wire resistance 1023 may be connected to the first via resistance 1031 through a fourth node N4.

In an embodiment, the third equivalent circuit 1030 may include a first via resistance 1031 and a second via resistance 1032. The first via resistance 1031 is an equivalent circuit representing the resistance value of the second via 712. The second via resistance 1032 is an equivalent circuit representing the resistance value of the third via 713.

In an embodiment, the first internal resistance 1012, which represents the resistance values of the first conductive path 222 and the first direct connection unit 223, may be connected to the first via resistance 1031 through the first node N1, and the first wire resistance 1013 disposed between the first node N1 and the third node N3 may be connected to the second via resistance 1032 through the third node N3.

In an embodiment, the second internal resistance 1022, which represents the resistance values of the second conductive path 232 and the second direct connection unit 233, may be connected to the second via resistance 1032 through the second node N2, and the second wire resistance 1023 disposed between the second node N2 and the fourth node N4 may be connected to the first via resistance 1031 through the second node N2.

In an embodiment, based on the first node N1 and the second node N2, the first via resistance 1031 and the second wire resistance 1023 are connected in series, and the second via resistance 1032 and the first wire resistance 1013 are connected in series. At this time, assuming that the sum of the first via resistance 1031 and the second wire resistance 1023 is a first resistance (not shown) and that the sum of the second via resistance 1032 and the first wire resistance 1013 is a second resistance (not shown), the first resistance and the second resistance may be connected in parallel between the first node N1 and the second node N2. Accordingly, the first PCB 220 and the second PCB 230 may adjust direct current resistance (DCR) through the extension connection units (e.g., the first extension connection unit 224 and the second extension connection unit 234) having extended wires, thereby improving current balance.

Figure 11:
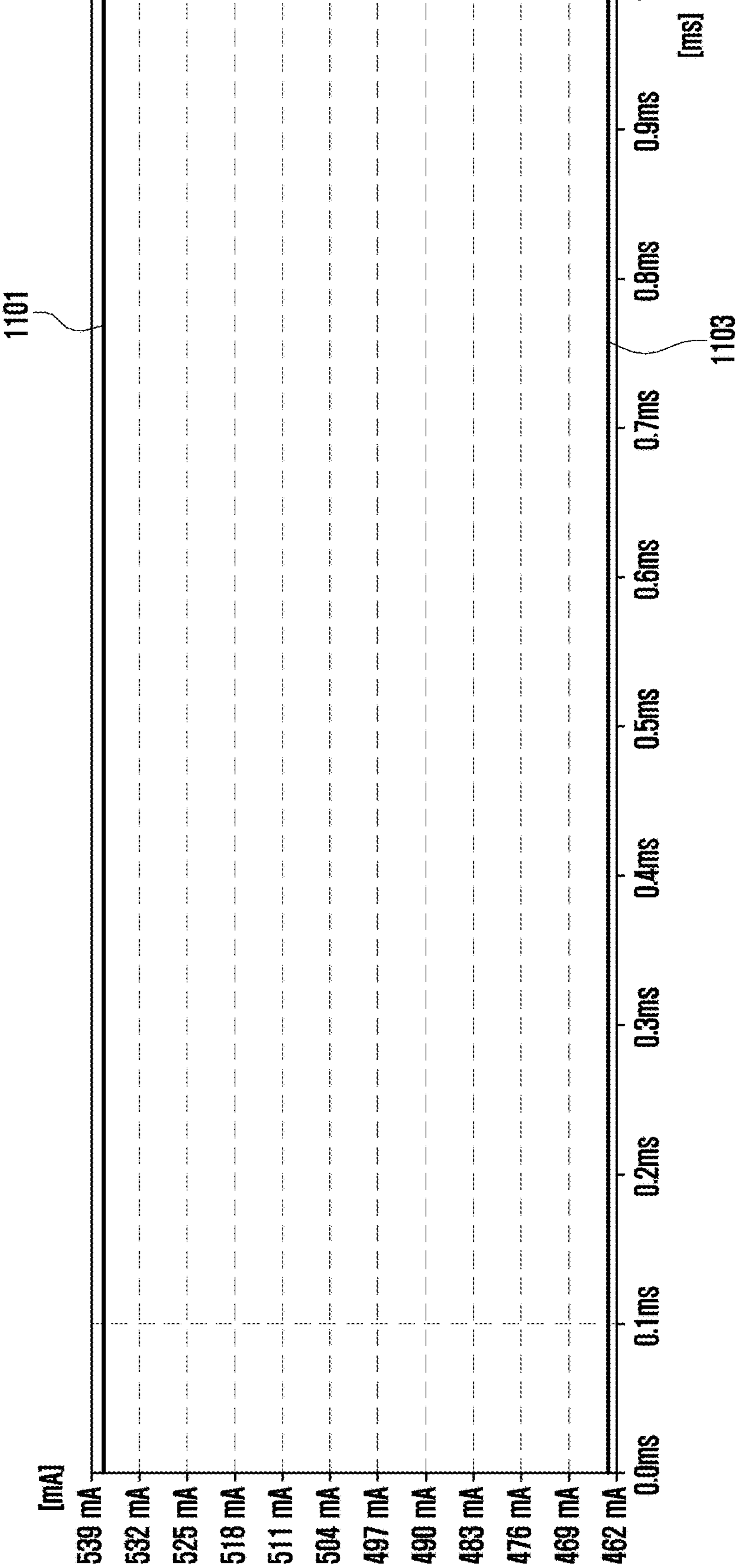
FIG. 11 is a graph illustrating the current of an electronic device including the interposer PCB in FIG. 7 according to various embodiments.

FIG. 11 is a graph illustrating the current of an electronic device 101 including the interposer PCB 210 in FIG. 7 according to various embodiments.

Referring to FIGS. 7, 8, 9, 10 and 11 (which may be referred to as FIGS. 7 to 11), graph 1101 represents the current flowing through the first via resistance 1031 or the second via 712, and graph 1103 represents the current flowing through the second via resistance 1032 or the third via 713.

Referring to graph 1101, the current flowing through the first via resistance 1031 or the second via 712 may be 463 mA.

Referring to graph 1103, the current flowing through the second via resistance 1032 or the third via 713 may be 537 mA.

If the wire is configured to have the shortest distance without considering embodiments of the disclosure, the current flowing through the respective vias may have imbalanced values due to the difference in resistance between the respective wires. For example, the current flowing through the first via resistance 1031 or the second via 712 of an electronic device, in which embodiments of the disclosure are not considered, may be 992 mA, and the current flowing through the second via resistance 1032 or the third via 713 may be 8 mA.

Referring to FIG. 10, the difference in current flowing through the first via resistance 1031 and the second via resistance 1032 to which an embodiment of the disclosure is applied may be smaller than the difference in current flowing through the first via resistance 1031 and the second via resistance 1032 to which an embodiment of the disclosure is not applied.

Figure 12:
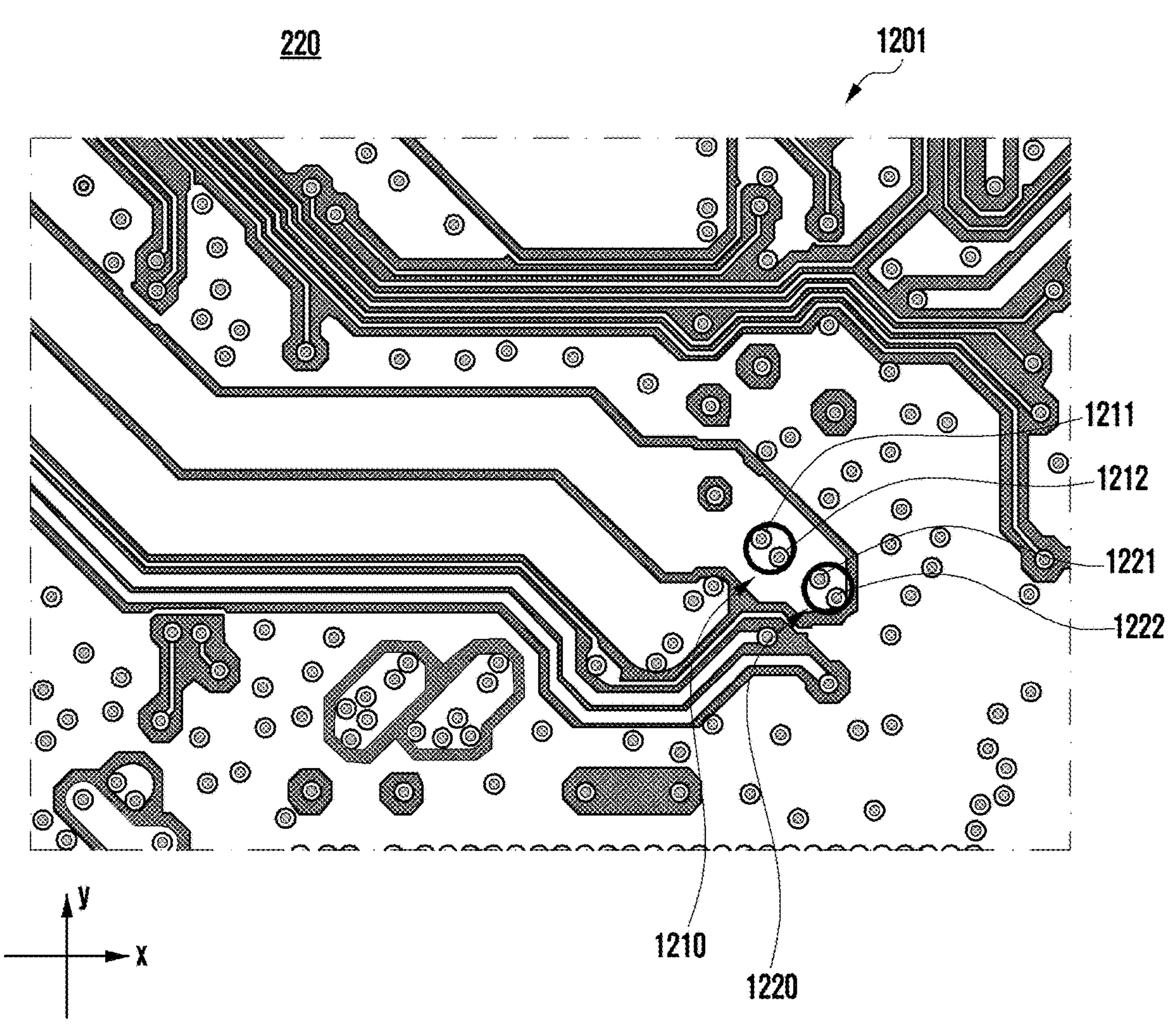
FIG. 12 is a diagram illustrating an example PCB layout of a first PCB according to various embodiments.

FIG. 12 is a diagram illustrating an example PCB layout 1201 of a first PCB 220 according to various embodiments.

In an embodiment, the PCB layout 1201 may include a plurality of contact areas 1210 and 1220. The first contact area 1210 may be an area obtained when the first contact portion 701 in FIG. 7 is viewed on the x-y plane. The second contact area 1220 may be an area obtained when the first contact portion 701 in FIG. 7 is viewed on the x-y plane.

In an embodiment, the first contact area 1210 may include a first via connection area 1211 and a second via connection area 1212. The first contact area 1210 may be electrically connected to the second via 712 in FIG. 7 using the first via connection area 1211 and the second via connection area 1212. The first via connection area 1211 and the second via connection area 1212 may be identical and similar to the via structure shown in FIGS. 5 and/or 6.

In an embodiment, the second contact area 1220 may include a third via connection area 1221 and a fourth via connection area 1222. The second contact area 1220 may be electrically connected to the third via 713 in FIG. 7 using the third via connection area 1221 and the fourth via connection area 1222. The third via connection area 1221 and the fourth via connection area 1222 may be identical and similar to the via structure shown in FIGS. 5 and/or 6.

In an embodiment, the first PCB 220 may be directly connected to the second via 712 in FIG. 7 through the first contact area 1210, and may be connected to the third via 713 in FIG. 7 through a bridge (for example, the first extension connection unit 224) and the second contact area 1220 in the PCB layout 1201.

Figure 13:
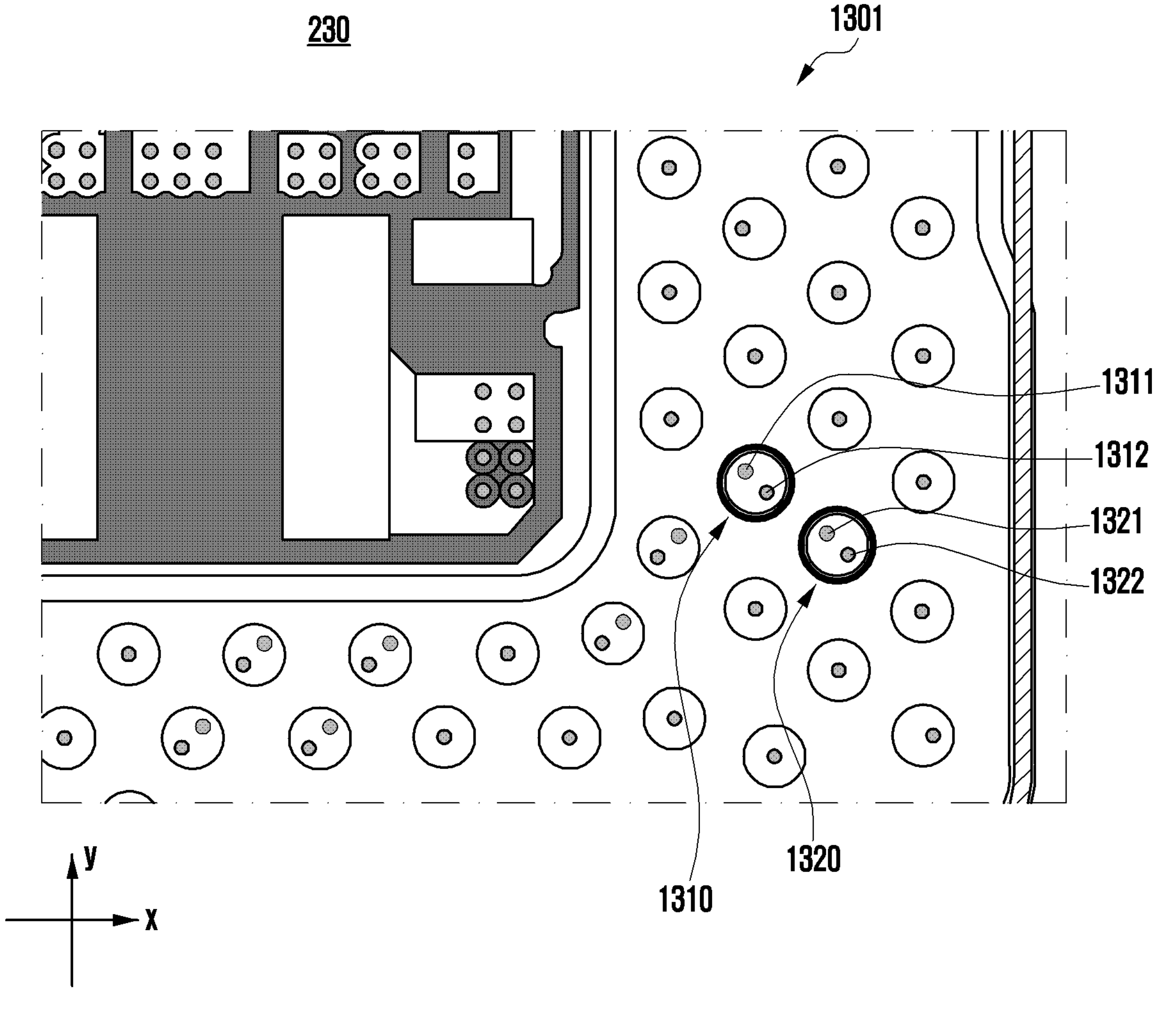
FIG. 13 is a diagram illustrating an example first PCB layout of a second PCB according to various embodiments.

FIG. 13 is a diagram illustrating an example first PCB layout 1301 of a second PCB 230 according to various embodiments.

Figure 14:
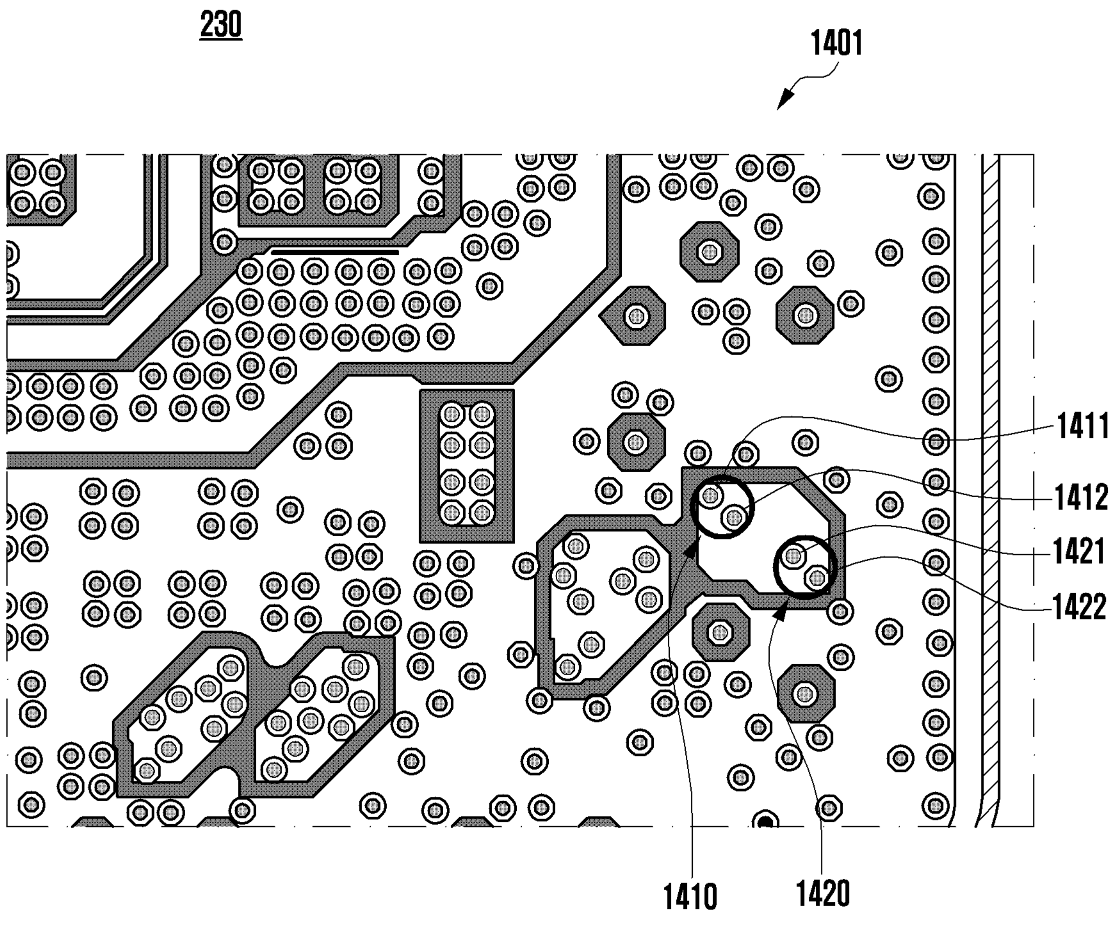
FIG. 14 is a diagram illustrating an example second PCB layout of a second PCB according to various embodiments.

FIG. 14 is a diagram illustrating an example second PCB layout 1401 of a second PCB 230 according to various embodiments.

Figure 15:
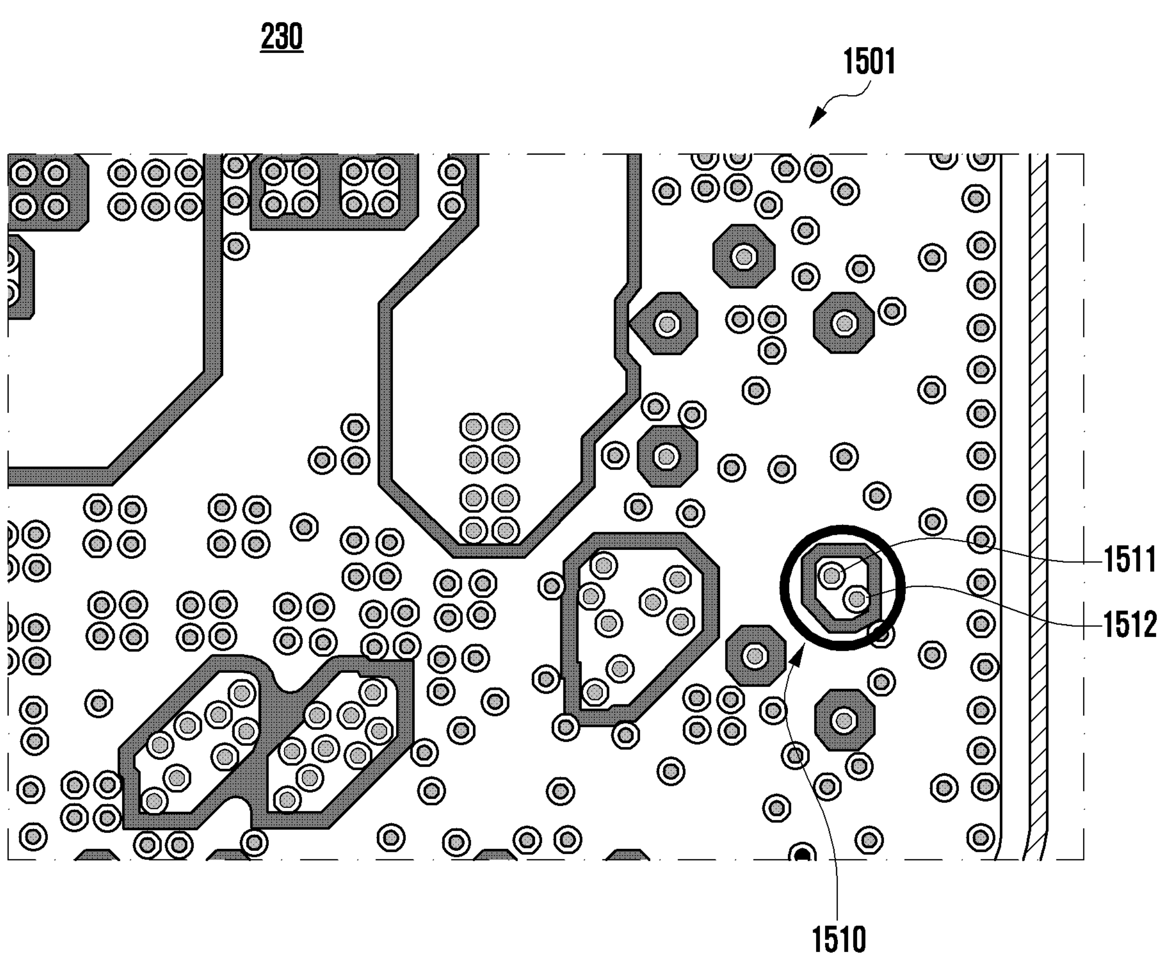
FIG. 15 is a diagram illustrating an example third PCB layout of a second PCB according to various embodiments.

FIG. 15 is a diagram illustrating an example third PCB layout 1501 of a second PCB 230 according to various embodiments.

Figure 16:
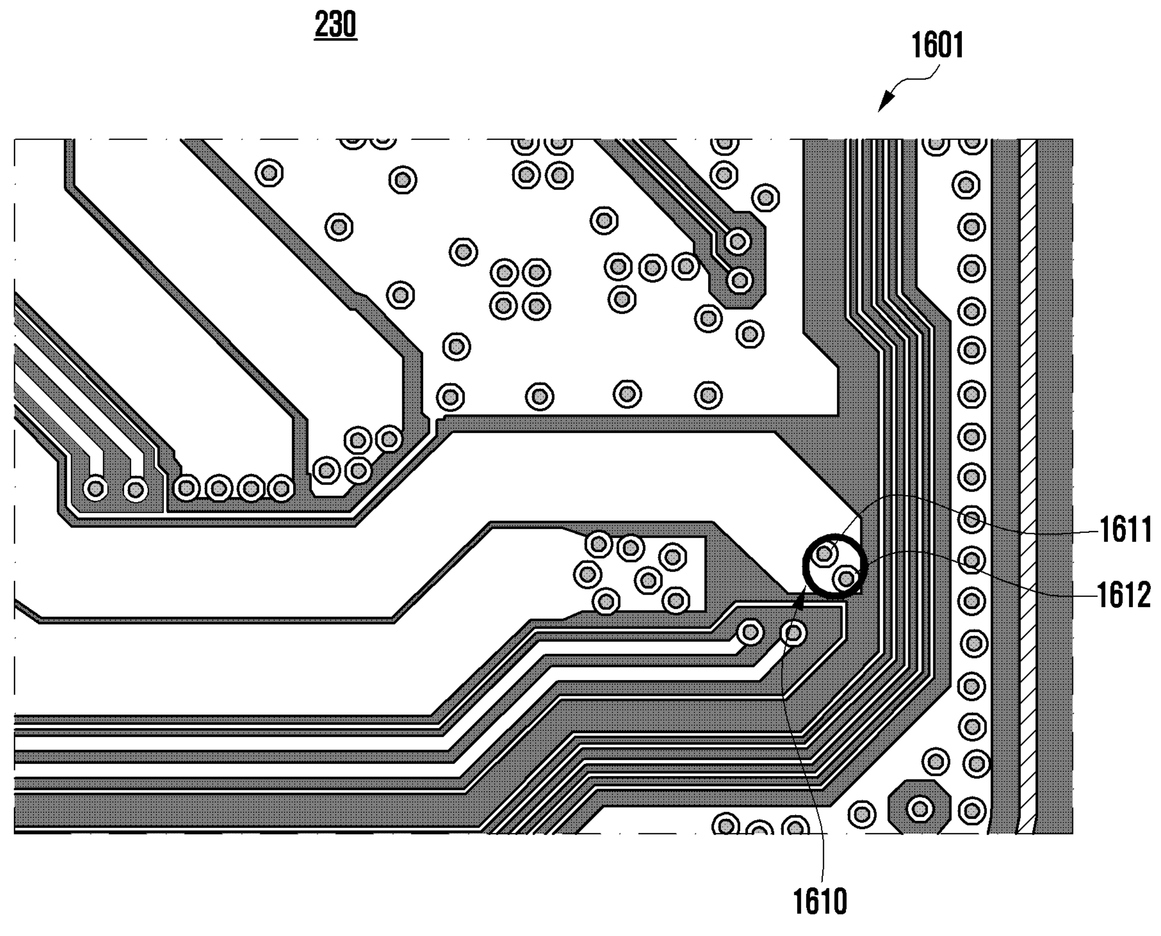
FIG. 16 is a diagram illustrating an example fourth PCB layout of a second PCB according to various embodiments.

FIG. 16 is a diagram illustrating an example fourth PCB layout 1601 of a second PCB 230 according to various embodiments.

The second PCB 230 may include a first PCB layout 1301, a second PCB layout 1401, a third PCB layout 1501, and/or a fourth PCB layout 1601.

The first PCB layout 1301, the second PCB layout 1401, the third PCB layout 1501, and/or the fourth PCB layout 1601 may comprise the second PCB 230.

The first PCB layout 1301, the second PCB layout 1401, the third PCB layout 1501, or the fourth PCB layout 1601 may be electrically connected through a penetrating electrode. The penetrating electrode may be identical or similar to the via structure shown in FIGS. 5 and/or 6.

Referring to FIG. 13, the first PCB layout 1301 may include a plurality of contact areas 1310 and 1320. The third contact area 1310 may be an area obtained when the second contact portion 702 in FIG. 7 is viewed on the x-y plane. The fourth contact area 1320 may be an area obtained when the second contact portion 702 in FIG. 7 is viewed on the x-y plane.

In an embodiment, the third contact area 1310 may include a fifth via connection area 1311 and a sixth via connection area 1312. The third contact area 1310 may be electrically connected to the second via 712 in FIG. 7 using the fifth via connection area 1311 and the sixth via connection area 1312. The fifth via connection area 1311 and the sixth via connection area 1312 may be identical and similar to the via structure shown in FIGS. 5 and/or 6.

In an embodiment, the fourth contact area 1320 may include a seventh via connection area 1321 and an eighth via connection area 1322. The fourth contact area 1320 may be electrically connected to the third via 713 in FIG. 7 using the seventh via connection area 1321 and the eighth via connection area 1322. The seventh via connection area 1321 and the eighth via connection area 1322 may be identical and similar to the via structure shown in FIGS. 5 and/or 6.

The first PCB layout 1301 may be directly connected to the third via 713 in FIG. 7 through the fourth contact area 1320, and may be connected to the second via 712 in FIG. 7 through a bridge (for example, the second extension connection unit 234) and the third contact area 1310 in the first PCB layout 1301.

Referring to FIG. 14, the second PCB layout 1401 may include a plurality of contact areas 1410 and 1420. The fifth contact area 1410 may be an area obtained when the second contact portion 702 in FIG. 7 is viewed in the −y-axis direction. The sixth contact area 1420 may be an area obtained when the second contact portion 702 in FIG. 7 is viewed in the −y-axis direction.

In an embodiment, the fifth contact area 1410 may include a ninth via connection area 1411 and a tenth via connection area 1412. The fifth contact area 1410 may be electrically connected to the second via 712 in FIG. 7 using the ninth via connection area 1411 and the tenth via connection area 1412. The ninth via connection area 1411 and the tenth via connection area 1412 may be identical and similar to the via structure shown in FIGS. 5 and/or 6.

In an embodiment, the sixth contact area 1420 may include an 11th via connection area 1421 and a 12th via connection area 1422. The sixth contact area 1420 may be electrically connected to the third via 713 in FIG. 7 using the 11th via connection area 1421 and the 12th via connection area 1422. The 11th via connection area 1421 and the 12th via connection area 1422 may be identical and similar to the via structure shown in FIGS. 5 and/or 6.

The second PCB layout 1401 may be directly connected to the third via 713 in FIG. 7 through the sixth contact area 1420, and may be connected to the second via 712 in FIG. 7 through a bridge (for example, the second extension connection unit 234) and the third contact area 1310 in the first PCB layout 1301.

Referring to FIG. 15, the third PCB layout 1501 may include a seventh contact area 1510. The seventh contact area 1510 may include a 13th via connection area 1511 and a 14th via connection area 1512.

Referring to FIG. 16, the fourth PCB layout 1601 may include an eighth contact area 1610. The eighth contact area 1610 may include a 15th via connection area 1611 and a 16th via connection area 1612. The seventh contact area 1510 and the eighth contact area 1610 may be directly connected to the third via 713 in FIG. 7. The 15th via connection area 1611 and the 16th via connection area 1612 may be identical and similar to the via structure shown in FIGS. 5 and/or 6.

Figure 17:
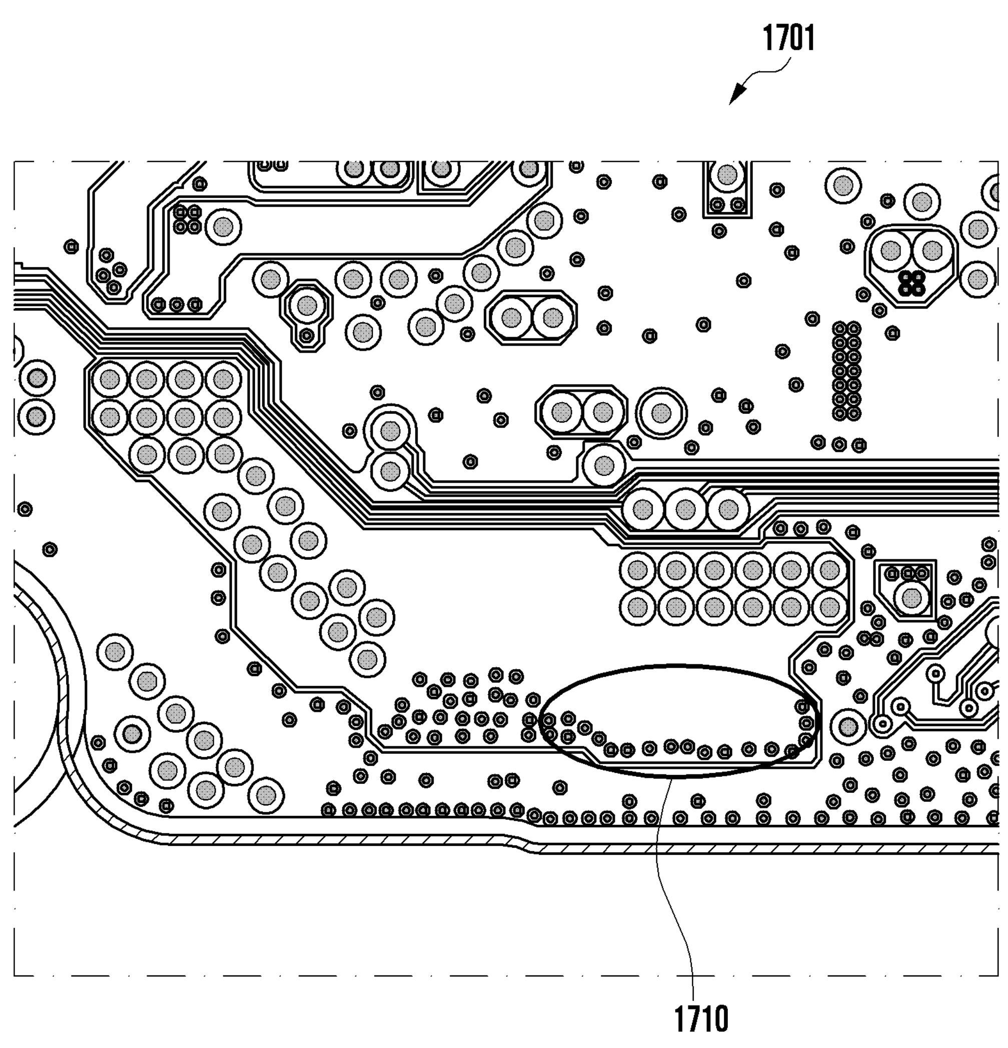
FIG. 17 is a diagram illustrating an example fifth PCB layout including a charging path to which the current balance structure is applied according to various embodiments.

FIG. 17 is a diagram illustrating an example fifth PCB layout 1701 including a charging path to which the current balance structure is applied according to various embodiments.

Figure 18:
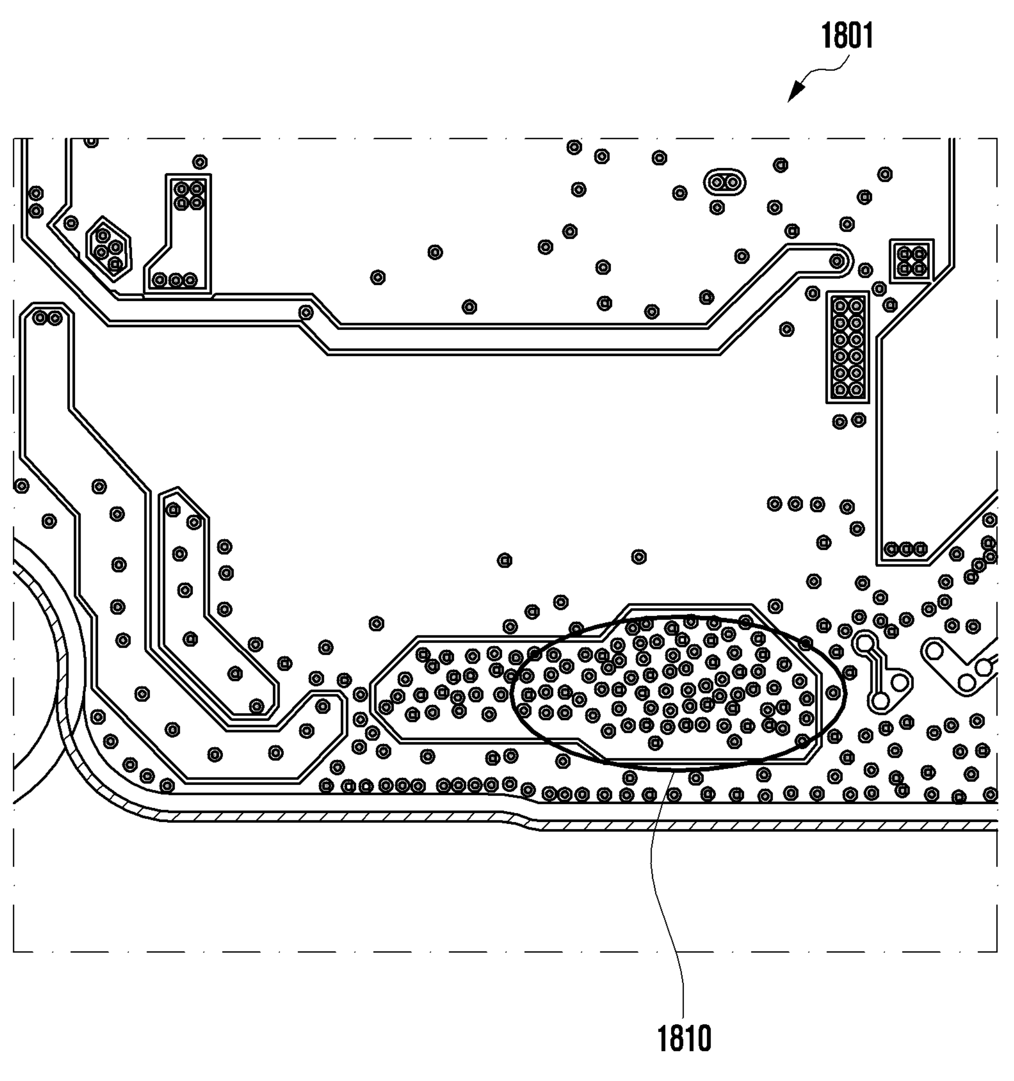
FIG. 18 is a diagram illustrating an example sixth PCB layout including a charging path to which the current balance structure is applied according to various embodiments.

FIG. 18 is a diagram illustrating an example sixth PCB layout 1801 including a charging path to which the current balance structure is applied according to various embodiments.

Figure 19:
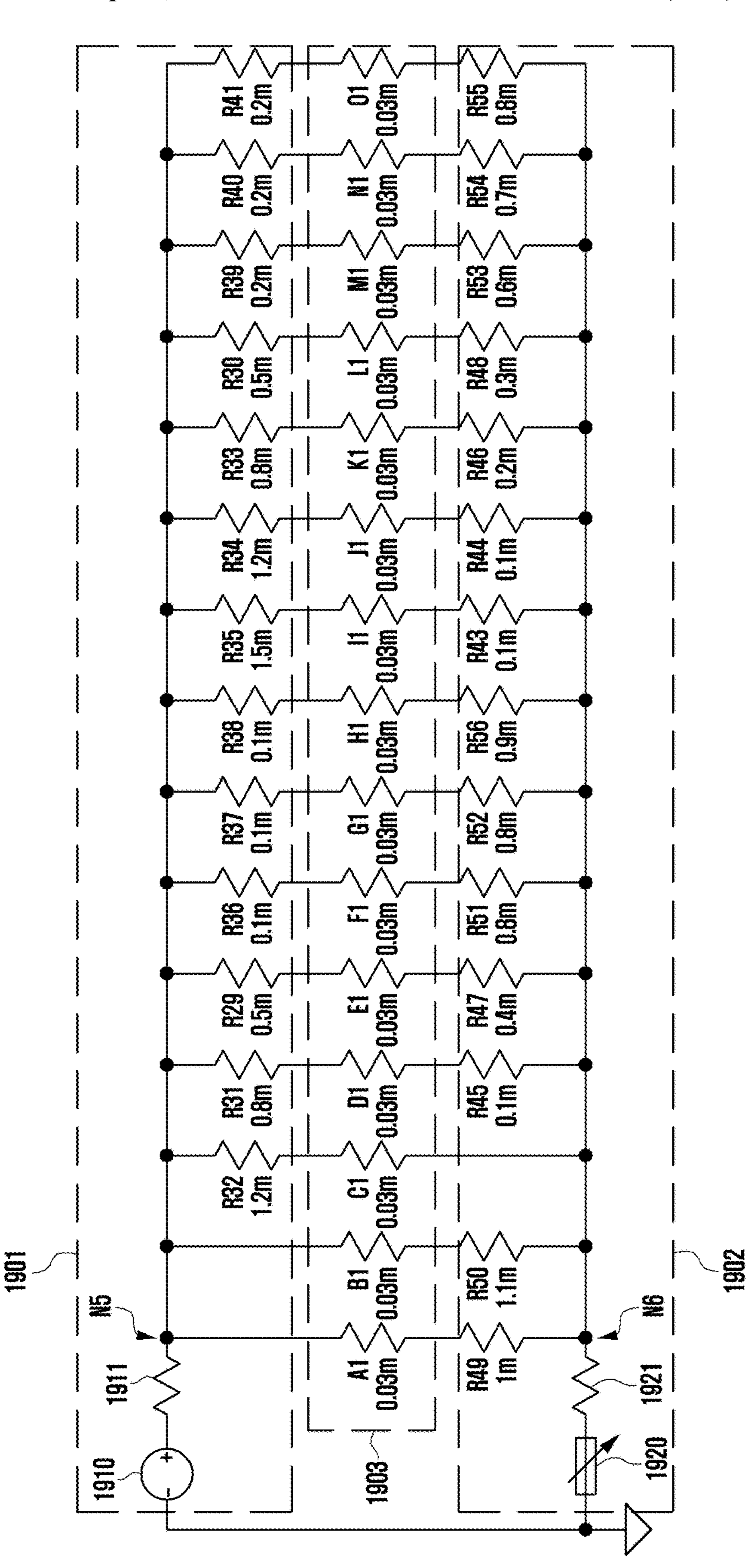
FIG. 19 is a diagram illustrating an equivalent circuit of an electronic device including a charging path to which a current balance structure is applied according to various embodiments.

FIG. 19 is a diagram illustrating an equivalent circuit of an electronic device 101 including a charging path to which a current balance structure is applied according to various embodiments.

Referring to FIGS. 17 and 18, the fifth PCB layout 1701 and the sixth PCB layout 1801 may have a stacked structure. The fifth PCB layout 1701 and the sixth PCB layout 1801 may be at least a part of the second PCB 230. The ninth contact area 1710 of the fifth PCB layout 1701 may be directly connected to the via (e.g., the third via 713 in FIG. 7), and the tenth contact area 1810 of the sixth PCB layout 1801 may be connected to the via (e.g., the second via 712 in FIG. 7) through a bridge (e.g., the second extension connection unit 234 in FIG. 7) of the sixth PCB layout 1801.

Referring to FIGS. 17, 18 and 19 (which may be referred to as FIGS. 17 to 19), the electronic device 101 may include a fourth equivalent circuit 1901, a fifth equivalent circuit 1902, and a sixth equivalent circuit 1903.

The fourth equivalent circuit 1901 represents the equivalent circuit of the first PCB 220. The fifth equivalent circuit 1902 represents an equivalent circuit of the second PCB 230 to which the charging pass in FIGS. 17 and 18 is applied. The sixth equivalent circuit 1903 represents the equivalent circuit of the interposer PCB 210.

In an embodiment, the fourth equivalent circuit 1901 may include a power source 1910, a third internal resistance 1911, and a plurality of first wire resistances R29, R30, R31, R32, R33, R34, R35, R36, R37, R38, R39, R40, and R41. The third internal resistance 1911 may be a resistance value corresponding to the first conductive path 222 in FIG. 7. At least some of the plurality of first wire resistances R29, R30, R31, R32, R33, R34, R35, R36, R37, R38, R39, R40, and R41 may be a resistance value corresponding to the first extension connection unit 224 in FIG. 7.

In an embodiment, the fifth equivalent circuit 1902 may include a load resistance 1920, a fourth internal resistance 1921, and a plurality of second wire resistances R43, R44, R45, R46, R47, R48, R49, R50, R51, R52, R53, R54, R55, and R56. The fourth internal resistance 1921 may be a resistance value corresponding to the second conductive path 232 in FIG. 7. At least some of the plurality of second wire resistances R43, R44, R45, R46, R47, R48, R49, R50, R51, R52, R53, R54, R55, and R56 may be a resistance value corresponding to the second extension connection unit 234 in FIG. 7.

In an embodiment, the sixth equivalent circuit 1903 may include a plurality of via resistances A1, B1, C1, D1, E1, F1, G1, H1, I1, J1, K1, L1, M1, N1, and O1.

In the electronic device 101, at least some of the plurality of via resistances A1, B1, C1, D1, E1, F1, G1, H1, I1, J1, K1, L1, M1, N1, and O1, the plurality of first wire resistances R29, R30, R31, R32, R33, R34, R35, R36, R37, R38, R39, R40, and R41, and the plurality of second wire resistances R43, R44, R45, R46, R47, R48, R49, R50, R51, R52, R53, R54, R55, and R56 may be connected in parallel between the fifth node N5 and the sixth node N6.

Table 1 shows comparison the current flowing through a via to which an embodiment of the disclosure is applied with the current flowing through a via to which an embodiment of the disclosure is not applied.

TABLE 1

| Vias | Via current when not applied (mA) | Via current of the disclosure (mA) |
|---|---|---|
| A1 | 745 | 527 |
| B1 | 643 | 480 |
| C1 | 382 | 441 |
| D1 | 505 | 584 |
| E1 | 643 | 584 |
| F1 | 745 | 584 |

TABLE 1-continued

| Vias | Via current when not applied (mA) | Via current of the disclosure (mA) |
|---|---|---|
| G1 | 643 | 584 |
| H1 | 504 | 527 |
| I1 | 288 | 333 |
| J1 | 353 | 408 |
| K1 | 456 | 527 |
| L1 | 565 | 654 |
| M1 | 565 | 654 |
| N1 | 505 | 584 |
| O1 | 456 | 527 |

Referring to Table 1, the maximum current flowing through the via to which the disclosure is not applied is 745 mA, the minimum current thereof is 288 mA, so that the current difference may be up to 457 mA. For example, the current flowing through via A1 and via F1 may be greater than the allowable current, and the current flowing through via I1 and via J1 may be less than the allowable current. The maximum current flowing through the via to which the disclosure is applied is 654 mA, and the minimum current thereof is 333 mA, so that the current difference may be up to 321 mA. In addition, the current differences between via A1 and via F1 and between via I1 and via J1 may become smaller and may approach the allowable current. The electronic device according to various embodiments set forth herein may be one of various types of electronic devices. The electronic device may include, for example, a portable communication device (e.g., a smart phone), a computer device, a portable multimedia device, a portable medical device, a camera, a wearable device, or a home appliance. The electronic device according to embodiments of the disclosure is not limited to those described above.

It should be appreciated that the various embodiments and the terms used therein are not intended to limit the technological features set forth herein to particular embodiments and the disclosure includes various changes, equivalents, or alternatives for a corresponding embodiment. With regard to the description of the drawings, similar reference numerals may be used to designate similar or relevant elements. It is to be understood that a singular form of a noun corresponding to an item may include one or more of the items, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one or all possible combinations of the items enumerated together in a corresponding one of the phrases. As used herein, such terms as "a first", "a second", "the first", and "the second" may be used to simply distinguish a corresponding element from another, and does not limit the elements in other aspect (e.g., importance or order). If an element (e.g., a first element) is referred to, with or without the term "operatively" or "communicatively", as "coupled with/to" or "connected with/to" another element (e.g., a second element), the element may be coupled/connected with/to the other element directly (e.g., wiredly), wirelessly, or via a third element.

As used in various embodiments of the disclosure, the term "module" may include a unit implemented in hardware, software, or firmware, or any combination thereof, and may be interchangeably used with other terms, for example, "logic," "logic block," "component," or "circuit". The "module" may be a single integrated component, or a minimum unit or part thereof, adapted to perform one or more functions. For example, according to an embodiment, the "module" may be implemented in the form of an application-specific integrated circuit (ASIC).

According to various embodiments, each element (e.g., a module or a program) of the above-described elements may include a single entity or multiple entities, and some of the multiple entities may be separately disposed in any other element. According to various embodiments, one or more of the above-described elements or operations may be omitted, or one or more other elements or operations may be added. Alternatively or additionally, a plurality of elements (e.g., modules or programs) may be integrated into a single element. In such a case, the integrated element may still perform one or more functions of each of the plurality of elements in the same or similar manner as they are performed by a corresponding one of the plurality of elements before the integration. According to various embodiments, operations performed by the module, the program, or another element may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:

an interposer printed circuit board (PCB) comprising at least two vias;

a first PCB comprising a first direct connection unit comprising a power supply circuit and configured to directly connect the power supply circuit to a first via, and a first extension connection unit comprising a conductive material configured to connect a second via through a wire extending from the first direct connection unit; and a second PCB comprising a second direct connection unit comprising a load circuit and configured to directly connect the load circuit to the second via, and a second extension connection unit comprising a conductive material configured to connect the first via through a wire extending from the second direct connection unit.

2. The electronic device according to claim 1, wherein the first PCB comprises a first conductive path comprising at least one conductor configured to electrically connect the power supply circuit and the first direct connection unit at a first node.

3. The electronic device according to claim 2, wherein the second PCB comprises a second conductive path comprising at least one conductor configured to electrically connect the load circuit and the second direct connection unit at a second node.

4. The electronic device according to claim 2, wherein the first PCB comprises a plurality of stacked PCBs.

5. The electronic device according to claim 4, wherein the first conductive path comprises penetrating electrodes for the plurality of PCBs, and wires for the respective PCBs.

6. The electronic device according to claim 3, wherein the second PCB comprises a plurality of stacked PCBs.

7. The electronic device according to claim 6, wherein the second conductive path comprises penetrating electrodes for the plurality of PCBs, and wires for the respective PCBs.

8. The electronic device according to claim 3, wherein the first via and the second extension connection unit are connected in series between the first node and the second node.

9. The electronic device according to claim 3, wherein the second via and the first extension connection unit are connected in series between the first node and the second node.

10. The electronic device according to claim 1, wherein the first extension connection unit extends in the form of a bridge from the first direct connection unit.

11. The electronic device according to claim 1, wherein the second extension connection unit extends in the form of a bridge from the second direct connection unit.

12. The electronic device according to claim 1, wherein the first PCB comprises:

a first contact area connected to the first via; and a second contact area connected to the second via.

13. The electronic device according to claim 12, wherein the first contact area and/or the second contact area comprises one or more via connection areas.

14. The electronic device according to claim 1, wherein the second PCB comprises:

a third contact area connected to the first via; and a fourth contact area connected to the second via.

15. The electronic device according to claim 14, wherein the third contact area and/or the fourth contact area comprises one or more via connection areas.

* * * * *